(12) United States Patent
Li

(10) Patent No.: US 10,862,494 B2
(45) Date of Patent: Dec. 8, 2020

(54) BACKGROUND OFFSET DRIFT CALIBRATION CIRCUIT AND METHOD FOR COMPARATOR

(71) Applicant: Xiamen University, Xiamen (CN)

(72) Inventor: Xiaochao Li, Xiamen (CN)

(73) Assignee: Xiamen University, Xiamen (CN)

(*) Notice: Subject to any disclaimer, the term of this patent is extended or adjusted under 35 U.S.C. 154(b) by 0 days.

(21) Appl. No.: 16/862,605

(22) Filed: Apr. 30, 2020

(65) Prior Publication Data

US 2020/0350920 A1  Nov. 5, 2020

(30) Foreign Application Priority Data

Apr. 30, 2019 (CN) .......................... 2019 1 0361085

(51) Int. Cl.
*H03M 1/10* (2006.01)
*H03K 5/24* (2006.01)

(52) U.S. Cl.
CPC ............ *H03M 1/1023* (2013.01); *H03K 5/24* (2013.01)

(58) Field of Classification Search
None
See application file for complete search history.

(56) References Cited

U.S. PATENT DOCUMENTS 7,084,674 B1 * 8/2006 Nairn .................. H03F 3/45183
327/66

FOREIGN PATENT DOCUMENTS

| CN | 103036538 B | 5/2016 |
| CN | 105049043 B | 5/2018 |
| CN | 109120268 A | 1/2019 |

\* cited by examiner

*Primary Examiner* — Jeffery S Zweizig
(74) *Attorney, Agent, or Firm* — Bayramoglu Law Offices LLC

(57) ABSTRACT

A background offset drift calibration circuit and method for comparator are proposed. The background calibration circuit and method are designed based on the approximate linear characteristic of the offset drift of a comparator caused by the variation of temperature and power supply. The calibration circuit for the comparators obtains the offset drift characteristic of each comparator by performing twice foreground calibration and selects the comparator with the largest drift as the reference comparator and other comparators as working comparators. The reference comparator is configured to track the offset drift and trigger the background calibration circuit of other working comparators. The working comparators compensate for the offset drift caused by the temperature or the power supply in the background by linear interpolation based on the offset drift characteristic of each comparator.

5 Claims, 2 Drawing Sheets

BACKGROUND OFFSET DRIFT CALIBRATION CIRCUIT AND METHOD FOR COMPARATOR

CROSS REFERENCE TO THE RELATED APPLICATIONS

This application is based upon and claims priority to Chinese Patent Application No. 201910361085.9, filed on Apr. 30, 2019, the entire contents of which are incorporated herein by reference.

TECHNICAL FIELD

The present invention relates to the field of designing a mixed-signal integrated circuit combining an analog circuit and a digital calibration circuit, and more particularly to a background calibration circuit and method for compensating the offset drift of a comparator caused by temperature and power supply fluctuations.

BACKGROUND

A comparator is a fundamental module in analog integrated circuits and is frequently used in an analog-to-digital converter (ADC). The performance of the comparator greatly influences the performance of the system. For example, the speed, accuracy and power consumption of the ADC substantially depend on the comparator used in the ADC, and thus, the comparator is critical to the analog-to-digital converter. However, the performance of the comparator is significantly limited by its offset voltage. This is especially the case as the feature size of the complementary metal-oxide-semiconductor (CMOS) technology continuously decreases. The offset caused by the mismatch of threshold voltage, feature size, area and parasitic capacitance increases accordingly. In order to achieve high-speed analog-to-digital conversion, therefore, multi-comparator architectures have become more common. These set ups require the offsets among the comparators to be well suppressed in order to ensure the conversion accuracy. As a result, the offset voltage of the comparator has become critical for the ADC.

The offset of the comparator is generally caused by the mismatch between the threshold voltage and the size of the input pair transistors. Although the offset of the comparator can be reduced by increasing the size of the input transistor, the large-size input transistor will inevitably cause an increase in power consumption. In general, designers prefer small-size devices to lower power consumption and kickback noise. However, the small-size devices will cause a large offset to the comparator, so the calibration techniques are usually adopted to present an appropriate calibration voltage to compensate for the offset between devices.

Offset calibration techniques for comparators include the foreground calibration technique and the background calibration technique as follows. (1) The foreground offset calibration technique is activated only when the circuit starts to work or during the idle time, so it has little impact on the overall speed and function of the system. A disadvantage of foreground offset calibration technique, however, is that it suffers from the offset drift with variation on the temperature and power supply voltage because the offset is not continuously monitored and calibrated in real time. (2) The background offset calibration technique performs calibration during normal operation of the comparator in order that it can suppress the offset voltage drift caused by the variation on the temperature, the power supply and other environmental factors. The background offset calibration technique, however, typically requires additional calibration phases or cycles to recalibrate the drift and the swapping of the analog input signals. This tends to affect the circuit linearity and interfere with the normal function of the comparator. Additionally, prior background offset calibration techniques require complicated analog circuits and digital control logic, which affects the working speed of the comparator, occupies a large chip area, causes additional power consumption and limits the performance of the comparator.

Another offset calibration technique, the auto-zero calibration technique, is a typical background offset calibration technique that adopts the feedback network to eliminate the input offset voltage of the comparator. This method requires an additional zeroing phase and feedback configuration, which is not suitable for high speed applications. In addition, the auto-zero calibration technique substantially increases the complexity of the analog circuit design, the chip area and the static power consumption.

It is well known that the offset voltage of transistors of a differential pair in the integrated circuit will drift with the variations in temperature and power supply voltage and thus interfere with the result of the foreground calibration. Through theoretical analysis, computer modeling and simulation and practical circuit testing, it has been found that the offset drift caused by the variations of temperature and power supply voltage indicates certain linearity characteristics. Hence, the offset drift can be calibrated by linear interpolation without implementing the traditional background calibration circuit and method. This has several advantages, including a simple calibration circuit, non-interference in the normal operation of the comparator and high calibration accuracy.

At present, relevant background arts on offset voltage calibration circuits and methods for comparators include the following.

The Chinese patent No. CN105049043B discloses a high-speed comparator with offset calibration function. In the high-speed comparator, the calibration module compensates the offset voltage of the comparator by injecting current. After the calibration is completed, the comparator enters the normal working mode. The calibration technique adopted by this high-speed comparator belongs to the foreground calibration mode.

The Chinese patent No. CN103036538B discloses a circuit and method for calibrating the offset voltage of the comparator. In this invention, the offset voltage of the comparator is calibrated by adjusting the bulk voltages of the input metal-oxide-semiconductor (MOS) transistors. The calibration module is adopted to detect the output of the comparator and output the compensation signal. Through successive approximations of N calibration clock cycles, the offset voltage can be quickly calibrated. The patented circuit can accurately calibrate a wide-ranging offset voltage. The calibration technique adopted by this circuit belongs to the foreground calibration mode.

Chinese patent No. CN109120268A discloses a method for calibrating the offset voltage of the dynamic comparator. In the method, a digital-to-analog converter of successive approximation analog-to-digital converter operates in two modes: calibration mode and normal operation mode. In the calibration mode, the successive approximation analog-to-digital converter is configured to quantize zero input in order to obtain the offset codeword. In normal operation mode, the capacitors in the calibration capacitor array are switched according to the offset codeword to compensate the offset voltage of the comparator so that the ADC can obtain calibrated codeword.

In summary, many offset calibration methods for comparators have been proposed. However, most of them are primarily focused on the foreground calibration technique for calibrating the offset of the comparator. Furthermore, the above-mentioned inventions do not disclose a solution to calibrate the offset voltage drift caused by temperature and power supply variations.

SUMMARY

Based on the above analysis, the offset drift of the comparator caused by variations in temperature and power supply degrades the effect of foreground calibration technique and the performance of the comparator. Furthermore, in consideration of the drawbacks of the existing background digital calibration technique, a background offset drift calibration circuit and method for comparator is proposed, which does not need additional auto-zero circuit or extra calibration phase, and can achieve high-accuracy performance in a wide variation on temperature and power supply voltage with simple logic and circuit implementation.

The background offset drift calibration circuit for the comparator includes an analog signal input port, a calibration switch circuit, a preamplifier circuit, a reset switch, a dynamic comparator circuit, a calibration control logic circuit, a bidirectional counter circuit, a digital-to-analog converter circuit, an offset calibration voltage input circuit and an output port. The calibration switch circuit is connected to a Vin+ terminal and a Vin− terminal of the analog signal input port, and the analog signal input port is connected to the preamplifier circuit and acts as an input of the preamplifier circuit. An input terminal of the preamplifier circuit is connected to a common-mode voltage input terminal Vcm, and an output of the preamplifier circuit is connected to an input of the dynamic comparator circuit. A positive input terminal and a negative input terminal of the dynamic comparator circuit are connected to the reset switch to reset the input of the dynamic comparator. An output of the dynamic comparator circuit is connected to a Vout+ terminal and a Vout− terminal of the output port and serves as an input of the calibration control logic circuit. One output of the calibration control logic circuit is configured as an input of the bidirectional counter circuit, and the other output of the calibration control logic circuit is connected to a control signal port of other comparators 11-1N. An output clock signal of the calibration control logic circuit serves as a working clock input of the bidirectional counter circuit and the digital-to-analog converter circuit. An output of the bidirectional counter circuit is connected to an input of the digital-to-analog converter circuit, and the digital-to-analog converter circuit converts a count value of the bidirectional counter circuit into a corresponding analog voltage. An output of the digital-to-analog converter circuit is connected to the offset calibration voltage input circuit and outputs an offset calibration voltage to the preamplifier circuit to calibrate an offset voltage, wherein N is a number of working comparators.

The calibration control logic circuit includes a first calibration value register, a twice-calibrating difference value register, an offset voltage drift value register, a drift calibration trigger circuit, a linear interpolation calculation circuit and a drift calibration value register. The first calibration value register is connected to the output of the bidirectional counter circuit to store a bidirectional counter value of a first foreground calibration of the comparator. The twice-calibrating difference value register is connected to the output of the bidirectional counter circuit to store a difference value between the first foreground calibration and a second foreground calibration of the comparator from the bidirectional counter. The twice-calibrating difference value register is further connected to the linear interpolation calculation circuit of the working comparators 11-1N in order to calculate a corresponding drift calibration value by linear interpolation. The offset voltage drift value register is connected to the output of the bidirectional counter circuit to store a difference value between a first calibration value and a current value of the bidirectional counter, wherein the difference value between the first calibration value and the current value of the bidirectional counter represents an offset voltage drift caused by a variation on temperature and power supply detected by a reference comparator. The drift calibration trigger circuit is connected to the linear interpolation calculation circuit of the working comparators 11-1N to trigger the linear interpolation calculation circuit of the working comparators 11-1N, and to generate the corresponding drift calibration value according to a drift characteristic curve of the respective working comparator. The linear interpolation calculation circuit of the working comparators 11-1N is connected to the drift calibration value register to store the generated drift calibration value in the drift calibration value register. The drift calibration value register is connected to the digital-to-analog converter circuit to output a calibration voltage to Cal+/Cal− terminal of an offset calibration voltage input port of the preamplifier circuit.

A background offset drift calibration method for comparator includes the following steps:

(1) powering on to restart all comparators, wherein all comparators enter an initial state;

(2) performing a first foreground offset voltage calibration on all comparators to calibrate an offset introduced by a manufacturing process, and storing a calibration value of the comparators in a first calibration value register, respectively;

(3) according to an application scenario, loading an offset drift calibration trigger value to a drift calibration trigger circuit to trigger a second foreground calibration, wherein the offset drift calibration trigger value can be set to 1 by default;

(4) choosing a comparator among comparators to track an offset drift, and comparing a value of an offset voltage drift value register with the offset drift calibration trigger value of the drift calibration trigger circuit, wherein when the value of the offset voltage drift value register is equal to the offset drift calibration trigger value, a second foreground calibration is triggered;

(5) performing the second foreground calibration on all comparators to obtain a twice-calibrating difference value between the second foreground offset calibration and the first foreground offset calibration, and storing the twice-calibrating difference value in a twice-calibrating difference value register;

(6) among all the comparators, choosing a comparator with a largest twice-calibrating difference value as a reference comparator to track the offset drift and trigger a background offset drift calibration of the other comparators;

(7) tracking the offset drift in real time by the reference comparator working in a tracking mode;

(8) allowing the other comparators to function in a normal operation mode as working comparators;

(9) detecting whether the offset drift exceeds one calibration step by the reference comparator, wherein if the reference comparator detects that the offset drift exceeds one calibration step, the drift calibration trigger circuit in the reference comparator triggers an offset drift control signal to the working comparators;

(10) receiving the drift trigger control signal from the reference comparator by the working comparators, and starting to perform an offset drift calibration operation;

(11) calculating a drift calibration value through a linear interpolation calculation circuit in a calibration control logic circuit of the working comparators and storing the drift calibration value in a drift calibration value register;

(12) performing a background offset drift calibration, converting the value in the drift calibration value register into an offset drift calibration voltage through a digital-to-analog converter circuit, and outputting the offset drift calibration voltage to Cal+/Cal− terminal of an offset calibration voltage input port of a preamplifier circuit of the comparator to calibrate the offset drift of the comparator; wherein, when the background offset drift calibration is performed, the working comparators can still function as comparators continuously;

(13) waiting for a completion signal of the background offset drift calibration by the working comparators; when the completion signal of the background offset drift calibration is acknowledged, the working comparator resumes normal function in a comparing operation mode, when the completion signal of the background offset drift calibration is not acknowledged, the working comparator continues to wait for the completion signal of the background offset drift calibration; and

(14) waiting for an offset drift calibration completion signal from all the working comparators by the reference comparator; wherein, if the offset drift calibration completion signal of all working comparators is acknowledged, the reference comparator resumes the tracking mode and proceeds a new round of tracking the offset drift in real time, otherwise, the reference comparator continues to wait for the offset drift calibration completion signal.

This background offset drift calibration circuit and method for comparator is based on the finding that the offset drift caused by the variations of temperature and power supply voltage indicates certain linearity characteristics. Hence, the offset drift can be calibrated by linear interpolation. Compared with the prior art, the advantages of this invention are listed as follows.

(1) The calibration circuit is simple. The offset drift characteristic curve of each comparator can be linearly approximated through twice foreground calibrations. The adoption of foreground calibration not only simplifies the design of the calibration circuit but also achieves high calibration accuracy.

(2) A reference comparator is configured to track the offset drift, and the background calibration value of the offset drift is calculated by linear interpolation to compensate for the offset drift caused by the temperature and/or the power supply. The working comparator can function normally without interruption while the offset drift calibration is performed in the background at the same time.

(3) This invention proposes a background offset calibration circuit and method for comparator that does not require extra calibration phase or cycles to recalibrate the drift. Additionally, there is no additional analog signal swapping necessary, which affects the linearity of the circuit and the normal operation of the comparator. The new circuit is able to compensate for the offset drift of the comparator caused by the variations in temperature and power supply in real time by the twice foreground calibrations.

DETAILED DESCRIPTION OF THE EMBODIMENTS

The present invention is further described in detail below in combination with embodiments and drawings.

Figure 1:
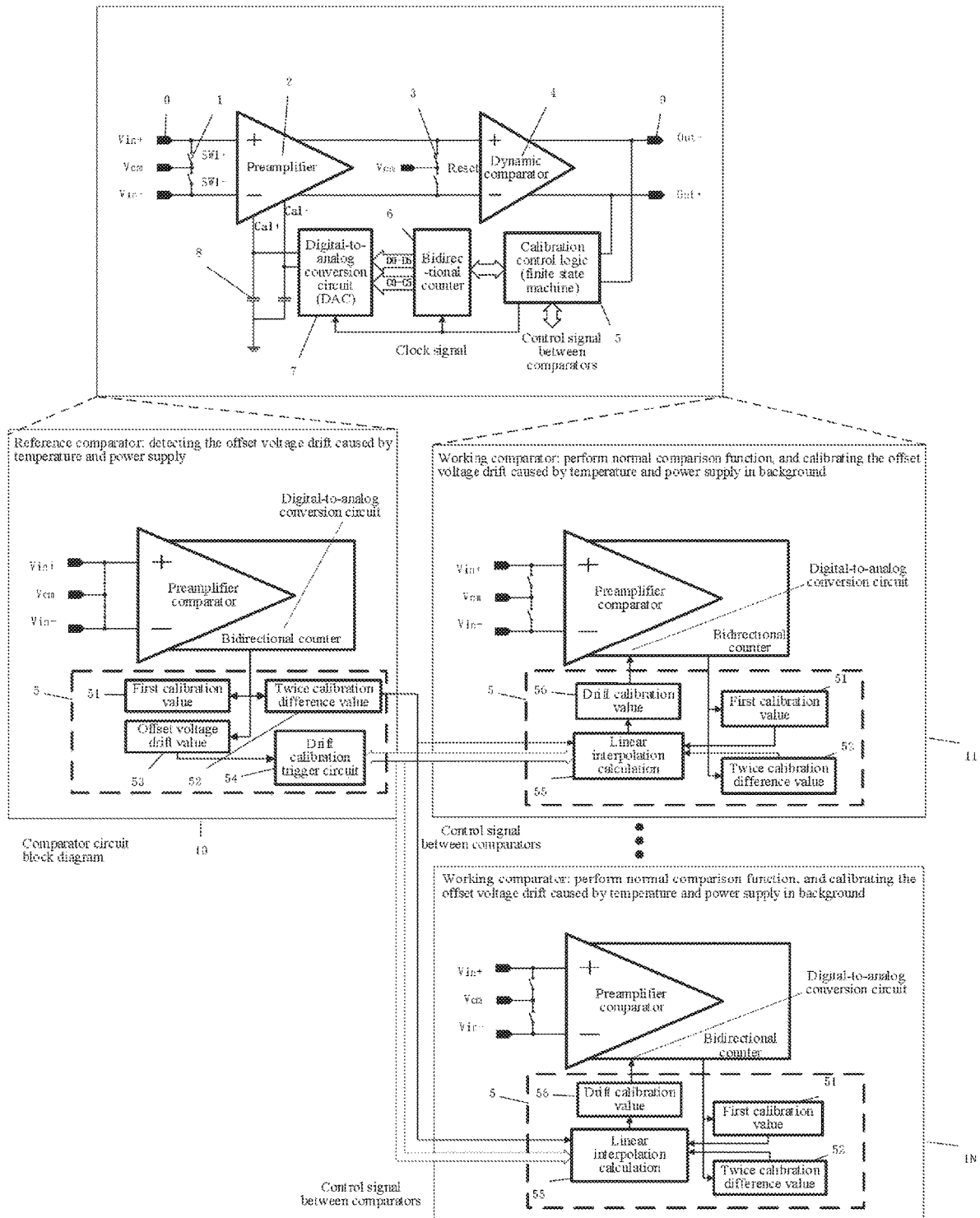
FIG. 1 is a block diagram of a background offset drift calibration circuit for comparator according to the present invention.

As shown in FIG. 1, according to an embodiment of the present invention, a background offset drift calibration circuit for a comparator includes the analog signal input port 0, the calibration switch circuit 1, the preamplifier circuit 2, the reset switch 3, the dynamic comparator circuit 4, the calibration control logic circuit 5, the bidirectional counter circuit 6, the digital-to-analog converter circuit 7, the offset calibration voltage input circuit 8 and the output port 9. The calibration switch circuit 1 is connected to the Vin+ terminal and the Vin− terminal of the analog signal input port 0, and the analog signal input port 0 is connected to the preamplifier circuit 2 and acts as the input of the preamplifier circuit 2. The input terminal of the preamplifier circuit 2 is connected to the common-mode voltage input terminal Vcm, and the output of the preamplifier circuit 2 is connected to the input of the dynamic comparator circuit 4. The positive input terminal and the negative input terminal of the dynamic comparator circuit 4 are connected to the reset switch 3 to reset the input of the dynamic comparator circuit 4. The output of the dynamic comparator circuit 4 is connected to the Vout+ terminal and the Vout− terminal of the output port 9 and the input of the calibration control logic circuit 5. One output of the calibration control logic circuit 5 is configured as the input of the bidirectional counter circuit 6, and the other output of the calibration control logic circuit 5 is connected to the control signal port of other comparators 11-1N. The output clock signal of the calibration control logic circuit 5 serves as the working clock input of the bidirectional counter circuit 6 and the digital-to-analog converter circuit 7. The output of the bidirectional counter circuit 6 is connected to the input of the digital-to-analog converter circuit 7, and the digital-to-analog converter circuit 7 converts the count value of the bidirectional counter circuit 6 into the corresponding analog voltage. The output of the digital-to-analog converter circuit 7 is connected to the offset calibration voltage input circuit 8 and outputs the offset calibration voltage to the preamplifier circuit 2 to compensate the offset, wherein N is the number of working comparators.

The calibration control logic circuit 5 includes the first calibration value register 51, the twice-calibrating difference value register 52, the offset voltage drift value register 53, the drift calibration trigger circuit 54, the linear interpolation calculation circuit 55 and the drift calibration value register 56. The first calibration value register 51 is connected to the output of the bidirectional counter circuit 6 to store the bidirectional counter value of the first foreground calibration of the comparator. The twice-calibrating difference value register 52 is connected to the output of the bidirectional counter circuit 6 to store the difference value between the first foreground calibration and the second foreground calibration of the comparator from the bidirectional counter. The twice-calibrating difference value register 52 is further connected to the linear interpolation calculation circuit 55 of the working comparators 11-1N to generate the corresponding drift calibration value. The offset voltage drift value register 53 is connected to the output of the bidirectional counter circuit 6 to store the difference value between the first calibration value and the current value of the bidirectional counter, wherein the difference value between the first calibration value and the current value of the bidirectional counter represents the offset voltage drift caused by the variations on temperature and the power supply detected by the reference comparator 10. The drift calibration trigger circuit 54 is connected to the linear interpolation calculation circuit 55 of the working comparators 11-1N to trigger the linear interpolation calculation circuit 55 of the working comparators 11-1N to generate the corresponding drift calibration value according to the drift characteristic curve of the respective working comparator. The linear interpolation calculation circuit 55 of the working comparators 11-1N is connected to the drift calibration value register 56 to store the generated drift calibration value in the drift calibration value register 56. The drift calibration value register 56 is connected to the digital-to-analog converter circuit 7 to output the calibration voltage to the Cal+/Cal− terminal of the offset calibration voltage input port 8 of the preamplifier circuit 2.

The embodiment relates to background offset drift calibration circuit and method for a comparator. The background calibration circuit and method are designed based on the approximately linearity characteristic of the offset drift of the comparator. The calibration circuit for the comparators obtains the offset drift characteristic of each comparator by means of performing the foreground calibration twice, and selects the comparator with the largest drift as the reference comparator and other comparators as the working comparators. The reference comparator is configured to track the offset drift and trigger the background calibration circuit of other working comparators. The working comparator calculates the background calibration value of the offset drift corresponding to different drift by linear interpolation to compensate the offset drift caused by the temperature and/or the power supply. When the background offset drift calibration is performed, the comparator circuit of the working comparator works normally without interruption.

The overall technical solution is shown in FIG. 1, the calibration circuit for the comparators includes the reference comparator 10 and a plurality of working comparators 11-1N, wherein the number of working comparators can be determined as needed. The circuit of the reference comparator is identical to the circuit of the working comparator, but the reference comparator and the working comparator each work in different working modes at run time, that is, the reference comparator works in a tracking mode and the working comparator works in a comparing mode.

Figure 2:
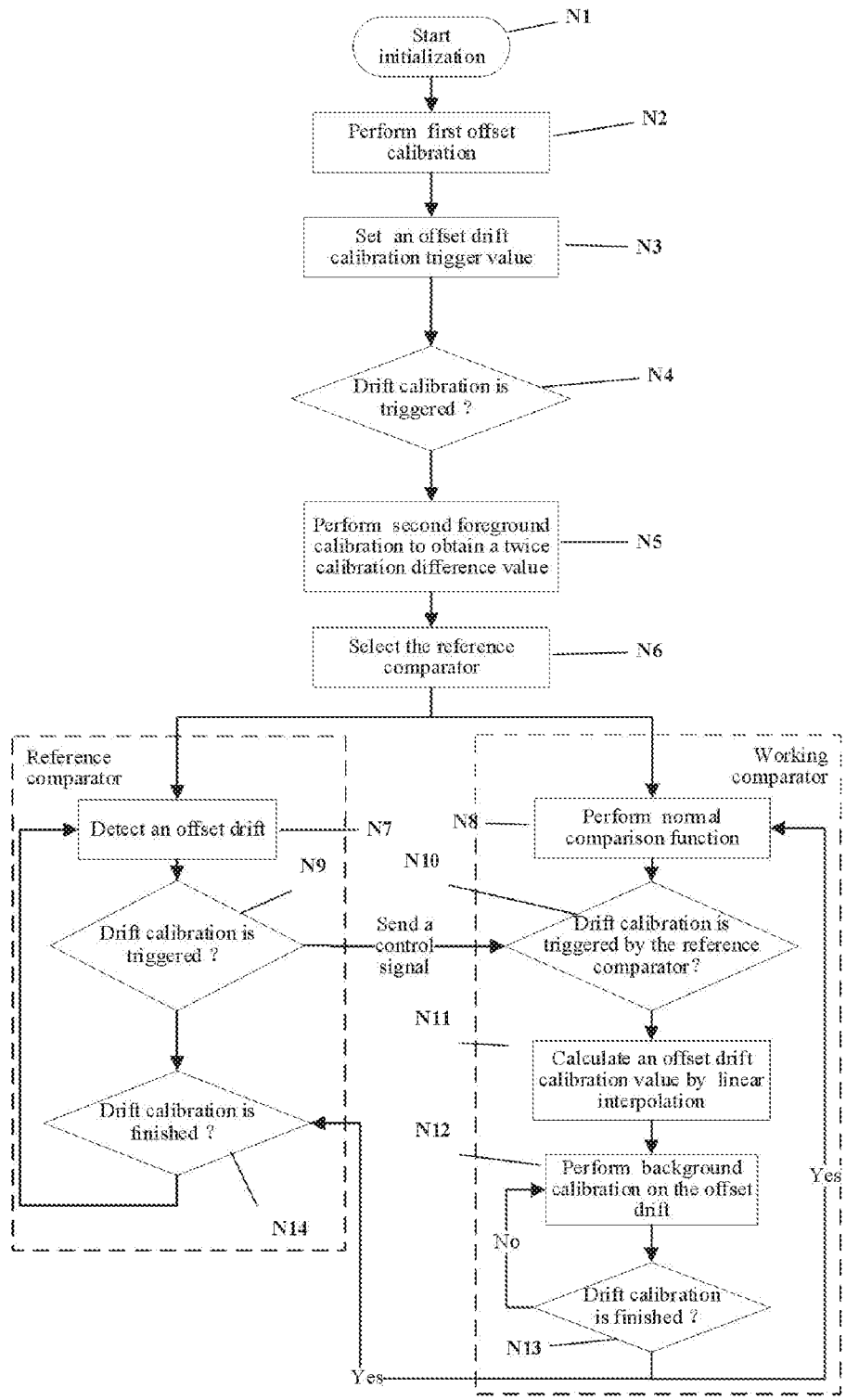
FIG. 2 is a flow chart of a background offset drift calibration method for comparator according to the present invention.

As shown in FIG. 2, the specific steps of the background offset drift calibration method for the comparator are as follows:

N1: all comparators are powered on to restart and enter the initial state;

N2: all comparators start the first foreground offset voltage calibration to calibrate the offset voltage introduced by the manufacturing process, and store the calibration value of the comparators in the first calibration value register 51, respectively;

N3: according to the application scenario, the offset drift calibration trigger value is loaded to the drift calibration trigger circuit to trigger a second foreground calibration, wherein the offset drift calibration trigger value can be set to 1 by default;

N4: a comparator is chosen to track the offset drift, and the value of the offset voltage drift value register is compared with the offset drift calibration trigger value of the drift calibration trigger circuit; if the value of the offset voltage drift value register is equal to the offset drift calibration trigger value, a second foreground calibration is triggered;

N5: all comparators perform the second foreground calibration to obtain the twice-calibrating difference value between the second foreground offset calibration and the first foreground offset calibration, and store the twice-calibrating difference value in the twice-calibrating difference value register 52;

N6: among all the comparators, the comparator with the largest twice-calibrating difference value is chosen as the reference comparator to track the offset drift and trigger the background calibration of other working comparators;

N7: the reference comparator works in a tracking mode and tracks the offset drift in real time;

N8: the other comparators function in a normal operation mode as working comparators:

N9: the reference comparator detects whether the offset drift exceeds one calibration step, and if the reference comparator detects that the offset drift exceeds one calibration step, the drift calibration trigger circuit in the reference comparator triggers an offset drift control signal to the working comparators;

N10: the working comparator acknowledges the drift trigger control signal from the reference comparator and starts to perform the offset drift calibration operation;

N11: the calibration control logic circuit 5 of the working comparator calculates the drift calibration value through the linear interpolation calculation circuit 55 and stores the drift calibration value in the drift calibration value register 56;

N12: the background offset drift calibration is performed; the value in the drift calibration value register 56 is converted into the offset drift calibration voltage through the digital-to-analog converter circuit 7, and the offset drift calibration voltage is presented to the Cal+/Cal− terminal of the offset calibration voltage input port 8 of the preamplifier circuit 2 of the comparator to calibrate the offset drift of the comparator; wherein, when the background offset drift calibration is performed, the working comparators can still function as comparators continuously;

N13: the working comparators wait for the completion signal of the background offset drift calibration; and when the completion signal of the background offset drift calibration is acknowledged, the working comparator resumes normal function in a comparing operation mode, otherwise, the working comparator continues to wait for the completion signal of the background offset drift calibration.

N14: the reference comparator waits for the offset drift calibration completion signal from all the working comparators; if the offset drift calibration completion signal of all working comparators is acknowledged, the reference comparator resumes the tracking mode and proceeds a new round of tracking the offset drift in real time, otherwise, the reference comparator continues to wait for the offset drift calibration completion signal.

The calibration circuit and method combine the respective advantages of foreground calibration and background calibration, that is, the calibration circuit based on the foreground calibration technique is simple and the normal function of the working comparator is not affected by the background calibration, thereby improving the performance of the comparator. In the practical application, the background offset calibration circuit and method for comparator, does not require an extra calibration phase or cycles to recalibrate the drift, and no additional analog signal swapping, which affects the linearity of the circuit and the normal operation of the comparator. The novel circuit is also able to compensate for the offset drift of the comparator caused by the variations in temperature and the power supply in real time by the twice foreground calibrations. This background offset calibration circuit and method for comparator not only simplifies the analog circuits and the digital control logic design but also reduces the chip area, power consumption and increases the working frequency of the comparator.

The invention claimed is:

1. A background offset drift calibration circuit for comparators, comprising a plurality of comparators, wherein the plurality of comparators comprises a reference comparator and a plurality of working comparators; wherein, the reference comparator is configured to detect an offset voltage drift caused by a temperature and a power supply, and the plurality of working comparators are configured to perform a background calibration on the offset voltage drift caused by the temperature and the power supply based on a tracking result of the reference comparator; wherein the reference comparator is a comparator with the largest offset voltage drift among the plurality of comparators; the reference comparator tracks the offset voltage drift and triggers the plurality of working comparators to compensate the offset voltage drift caused by the temperature and the power supply by linear interpolation in a background;

wherein, the offset voltage drift of each of the plurality of the comparators caused by variations of the temperature and the power supply indicates predetermined linearity characteristics for the linear interpolation.

2. The background offset drift calibration circuit for the comparators according to claim 1, wherein, a circuit of the reference comparator is identical to a circuit of the plurality of working comparators, the reference comparator works in a tracking mode, and the plurality of working comparators work in a comparing mode.

3. The background offset drift calibration circuit for the comparators according to claim 1, comprising an analog signal input port, a calibration switch circuit, a preamplifier circuit, a reset switch, a dynamic comparator circuit, a calibration control logic circuit, a bidirectional counter circuit, a digital-to-analog converter circuit, an offset calibration voltage input circuit and an output port; wherein the calibration switch circuit is connected to a Vin+ terminal and a Vin− terminal of the analog signal input port; the analog signal input port is connected to the preamplifier circuit and the analog signal input port acts as an input of the preamplifier circuit; an input terminal of the preamplifier circuit is connected to a common-mode voltage input terminal Vcm; an output of the preamplifier circuit is connected to an input of the dynamic comparator circuit; a positive input terminal and a negative input terminal of the dynamic comparator circuit are connected to the reset switch to reset the input of the dynamic comparator; an output of the dynamic comparator circuit is connected to a Vout+ terminal and a Vout− terminal of the output port and the output of the dynamic comparator circuit serves as an input of the calibration control logic circuit; a first output of the calibration control logic circuit is configured as an input of the bidirectional counter circuit, and a second output of the calibration control logic circuit is connected to a control signal port of the plurality of working comparators; an output clock signal of the calibration control logic circuit serves as a working clock input of the bidirectional counter circuit and a working clock input of the digital-to-analog converter circuit; an output of the bidirectional counter circuit is connected to an input of the digital-to-analog converter circuit, and the digital-to-analog converter circuit converts a count value of the bidirectional counter circuit into an analog voltage corresponding the count value; and an output of the digital-to-analog converter circuit is connected to the offset calibration voltage input circuit and the output of the digital-to-analog converter circuit outputs an offset calibration voltage to the preamplifier circuit to calibrate an offset.

4. The background offset drift calibration circuit for the comparators according to claim 3, wherein, the calibration control logic circuit comprises a first calibration value register, a twice-calibrating difference value register, an offset voltage drift value register, a drift calibration trigger circuit, a linear interpolation calculation circuit and a drift calibration value register; wherein the first calibration value register is connected to the output of the bidirectional counter circuit to store a bidirectional counter value of a first foreground calibration of each of the plurality of comparators; the twice-calibrating difference value register is connected to the output of the bidirectional counter circuit to store a difference value between the first foreground calibration and a second foreground calibration of the comparator from the bidirectional counter; the twice-calibrating difference value register is further connected to the linear interpolation calculation circuit of the plurality of working comparators to calculate a drift calibration value; the offset voltage drift value register is connected to the output of the bidirectional counter circuit to store a difference value between a first calibration value and a current value of the bidirectional counter, wherein the difference value between the first calibration value and the current value of the bidirectional counter represents the offset voltage drift caused by the temperature and the power supply detected by the reference comparator; the drift calibration trigger circuit is connected to the linear interpolation calculation circuit of the plurality of working comparators to trigger the linear interpolation calculation circuit of the plurality of working comparators and the linear interpolation calculation circuit is configured to calculate the drift calibration value according to an approximate linear drift characteristic curve of each of the plurality of working comparators; the linear interpolation calculation circuit of the plurality of working comparators is connected to the drift calibration value register to store the generated drift calibration value in the drift calibration value register; the drift calibration value register is connected to the digital-to-analog converter circuit to output the offset calibration voltage to Cal+/Cal− terminal of an offset calibration voltage input port of the preamplifier circuit.

5. A background offset drift calibration method for comparators, comprising the following steps:

(1) powering on to restart the comparators, wherein the comparators enter an initial state;

(2) performing a first foreground offset calibration on the comparators to calibrate an offset voltage introduced by a manufacturing process, and storing a calibration value of the comparators in a first calibration value register, respectively;

(3) according to an application scenario, loading an offset drift calibration trigger value to a drift calibration trigger circuit to trigger a second foreground offset calibration, wherein the offset drift calibration trigger value can be set to 1 by default;

(4) choosing a comparator among the comparators to track an offset drift, and comparing a value of an offset voltage drift value register with the offset drift calibration trigger value of the drift calibration trigger circuit, wherein when the value of the offset voltage drift value register is equal to the offset drift calibration trigger value, the second foreground offset calibration is triggered;

(5) performing the second foreground offset calibration on the comparators to obtain a twice-calibrating difference value between the second foreground offset calibration and the first foreground offset calibration, and storing the twice-calibrating difference value in a twice-calibrating difference value register;

(6) among all the comparators, choosing a comparator with a largest twice-calibrating difference value as a reference comparator to track the offset drift and trigger a background calibration of working comparators; wherein the working comparators is the comparators excluding the reference comparator;

(7) tracking the offset drift in real time by the reference comparator working in a tracking mode;

(8) allowing the working comparators to function in a normal comparing operation mode;

(9) detecting whether the offset drift exceeds one calibration step by the reference comparator, wherein when the reference comparator detects that the offset drift exceeds one calibration step, the drift calibration trigger circuit in the reference comparator triggers an offset drift control signal to the working comparators;

(10) receiving the drift trigger control signal from the reference comparator by the working comparators, and starting to perform an offset drift calibration operation;

(11) calculating a drift calibration value through a linear interpolation calculation circuit in a calibration control logic circuit of the working comparators and storing the drift calibration value in a drift calibration value register;

(12) performing a background offset drift calibration, converting the value in the drift calibration value register into an offset drift calibration voltage through a digital-to-analog converter circuit, and outputting the offset drift calibration voltage to Cal+/Cal− terminal of an offset calibration voltage input port of a preamplifier circuit of the working comparators to calibrate the offset drift of the working comparators; wherein, when the background offset drift calibration is performed, the working comparators still function in a normal operation mode continuously;

(13) waiting for a completion signal of the background offset drift calibration by the working comparators; when the completion signal of the background offset drift calibration is acknowledged, the working comparator resumes normal function in a comparing operation mode, when the completion signal of the background offset drift calibration is not acknowledged, the working comparator continues to wait for the completion signal of the background offset drift calibration; and

(14) waiting for an offset drift calibration completion signal from all the working comparators by the reference comparator; wherein, when the offset drift calibration completion signal of all the working comparators is acknowledged, the reference comparator resumes the tracking mode and proceeds a new round of tracking the offset drift in real time, when the offset drift calibration completion signal of all the working comparators is not acknowledged, the reference comparator continues to wait for the offset drift calibration completion signal.

* * * * *